(12) United States Patent
Ho et al.

(10) Patent No.: US 7,859,365 B2
(45) Date of Patent: Dec. 28, 2010

(54) LOW FREQUENCY PROCESS-VARIATION-INSENSITIVE TEMPERATURE-STABLE MICROMECHANICAL RESONATORS

(75) Inventors: Gavin Kar-Fai Ho, Cambridge, MA (US); Farrokh Ayazi, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 162 days.

(21) Appl. No.: 12/001,946

(22) Filed: Dec. 13, 2007

(65) Prior Publication Data

US 2008/0186109 A1 Aug. 7, 2008

Related U.S. Application Data

(60) Provisional application No. 60/869,818, filed on Dec. 13, 2006.

(51) Int. Cl.
*H03H 9/24* (2006.01)
*H03H 9/125* (2006.01)
*H03H 9/46* (2006.01)
*H03H 3/013* (2006.01)
*H03B 5/30* (2006.01)

(52) U.S. Cl. .................. 333/186; 333/188; 333/200; 310/309; 331/154

(58) Field of Classification Search ................ 333/186, 333/188, 200; 310/309; 331/154, 156
See application file for complete search history.

(56) References Cited

U.S. PATENT DOCUMENTS

| | | | |
|---|---|---|---|
| 5,025,346 A * | 6/1991 | Tang et al. ............... 361/283.1 |
| 5,640,133 A * | 6/1997 | MacDonald et al. ......... 333/197 |
| 6,393,913 B1 * | 5/2002 | Dyck et al. ............... 73/504.12 |
| 6,445,106 B1 * | 9/2002 | Ma et al. ..................... 310/309 |
| 6,630,871 B2 * | 10/2003 | Ma et al. .................. 331/116 M |
| 6,744,174 B2 * | 6/2004 | Paden et al. ................. 310/309 |
| 6,940,370 B2 * | 9/2005 | Bircumshaw et al. ....... 333/197 |
| 6,978,673 B2 * | 12/2005 | Johnson et al. .......... 73/504.12 |
| 7,071,793 B2 * | 7/2006 | Lutz et al. ................... 333/186 |
| 7,176,770 B2 | 2/2007 | Ayazi et al. |
| 7,511,870 B2 | 3/2009 | Ho et al. |
| 7,542,188 B2 * | 6/2009 | Zhou et al. .................. 310/309 |
| 2002/0127760 A1 * | 9/2002 | Yeh et al. ...................... 438/50 |
| 2005/0073078 A1 * | 4/2005 | Lutz et al. ................... 267/136 |
| 2009/0189481 A1 * | 7/2009 | Kaajakari .................... 310/309 |

\* cited by examiner

*Primary Examiner*—Barbara Summons
(74) *Attorney, Agent, or Firm*—Thomas, Kayden, Horstemeyer & Risley, LLP

(57) ABSTRACT

Disclosed are micromechanical resonators having features that compensate for process variations and provide improved inherent temperature stability. Exemplary resonators may comprise comb drive resonators or parallel-plate drive resonators. The resonators comprise a (silicon-on-insulator) substrate with resonator apparatus formed therein. The resonator apparatus has one or more anchors connected to the substrate, at least one excitation/sense port that is electrically insulated from the substrate, and a resonator. The resonator comprises one or more flexural members connected to the one or more anchors that are separated from the substrate and separated from the excitation/sense port by gaps. A mass is coupled to flexural members, is separated from the substrate, and comprises a grid. Process compensation is achieved using a resonator mass in the form of a grid of lines that form holes or lines through the mass, wherein widths of lines of the grid are approximately ⅓ the width of the flexural members. Temperature stability is provided using silicon dioxide on at least one of the surfaces of the flexural members.

17 Claims, 7 Drawing Sheets

LOW FREQUENCY PROCESS-VARIATION-INSENSITIVE TEMPERATURE-STABLE MICROMECHANICAL RESONATORS

CROSS REFERENCE TO RELATED APPLICATIONS

This application claims priority to copending U.S. provisional application entitled "ROBUST REAL-TIME CLOCK PROCESS-VARIATION-INSENSITIVE TEMPERATURE-STABLE MICROMECHANICAL RESONATORS AND METHODS OF FABRICATING THE SAME" having Ser. No. 60/869,818, filed Dec. 13, 2006.

BACKGROUND

The present invention relates generally to micromechanical resonators, and more particularly, to process-variation-insensitive, temperature-stable micromechanical resonators.

Micromechanical resonators are strong candidates for integrated microelectronic solutions requiring a stable frequency reference. In particular, they have strong potential for replacement of large off-chip quartz resonators. Micromechanical resonators, fabricated in a manner similar to microelectronic devices, are subject to processing variations. As the size of substrates (wafers) increase, the variation of critical dimension (CD) variation typically increases. For this reason, planar resonator dimensions, and subsequently, their natural frequency, will vary on the substrate. Disclosed is a design for manufacturability (DFM) scheme to reduce the frequency divergence caused by critical dimension variations to target two potential applications: real time clocks (RTC) and high frequency reference oscillators.

Another performance metric in frequency references is temperature stability. In most materials, the acoustic velocity $v_\alpha$ is dependent on temperature. The natural frequency of a structure is directly proportional to the $v_\alpha$ and inversely proportional to dimension L:

$$f = \frac{\beta_i}{L} v_a,$$

$$v_a = \sqrt{\frac{C}{\rho}}$$

where $\beta_i$ is a dimensionless parameter. In the most simplified form, the acoustic velocity is the square root of the stiffness coefficient C over density $\rho$.

Temperature stability of the resonator is ensured when the fractional temperature gradient of acoustic velocity $\gamma_{v\alpha}$ is equal to the linear thermal expansion coefficient $\alpha$ since $$\frac{1}{f}\frac{df}{dt} = -\frac{1}{L}\frac{dL}{dT} + \frac{1}{v_a}\frac{dv_a}{dT} = -\alpha + \gamma_{v\alpha}.$$

In general, materials have a positive $\alpha$. With the rare exception of quartz and silicon dioxide, materials have a negative $\gamma_{v\alpha}$. Therefore, resonators made of semiconductor materials exclusively will always have an undesirable temperature sensitivity. It would be desirable to reduce the inherent temperature dependence using a material with positive $\gamma_{v\alpha}$. It would also be desirable to have process-variation-insensitive, temperature-stable micromechanical resonators.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
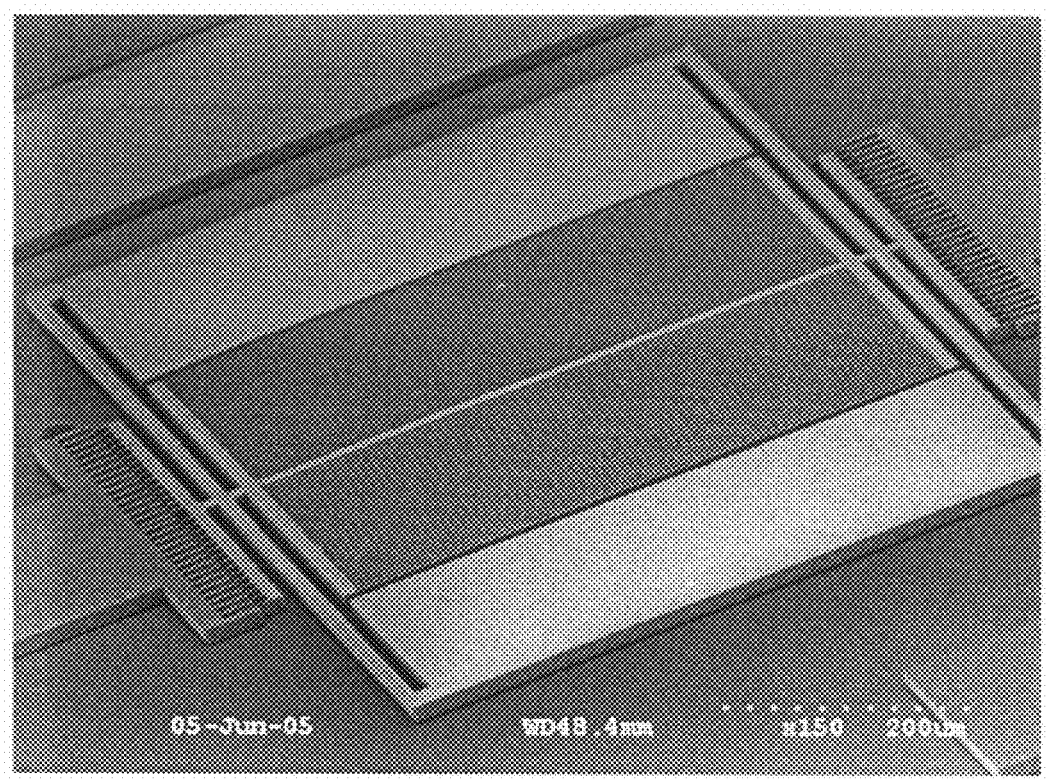
FIG. 1 is a scanning electron microscope (SEM) view of an exemplary comb drive resonator.

Referring to the drawing figures, disclosed are micromechanical resonators 10 having features that compensate for process variations and provide improved inherent temperature stability. In particular, comb-drive and parallel plate drive process-variation-insensitive, temperature-stable micromechanical resonators 10 are disclosed. One application for such resonators 10 is in low frequency real-time clock oscillators.

An exemplary comb drive resonator 10 is shown in FIG. 1. More particularly, FIG. 1 is a scanning electron microscope (SEM) view of the exemplary comb drive resonator 10. The exemplary resonators described herein may be fabricated using fabrication processes described in U.S. Pat. No. 7,176,770, issued Feb. 13, 2007, and U.S. application Ser. No. 11/251,197, filed Oct. 15, 2005, for example, the contents of which are incorporated herein by reference in their entirety.

The exemplary comb drive resonator 10 comprises a substrate 11 and resonator apparatus 12 formed in the substrate 11. The substrate 11 is preferably a silicon-on-insulator (SOI) substrate 11. The resonator apparatus 12 comprises one or more anchors 13 connected to the substrate 11. The resonator apparatus 12 comprises at least one input/output port 14, 15, or excitation/sense port 14, 15, that is electrically insulated from the substrate 11. The resonator apparatus 12 also comprises a resonator 20.

The resonator 20 comprises one or more flexural members 21 connected to the one or more anchors 13 that are separated from the substrate 11 and separated from the at least one excitation/sense port 14, 15 by one or more gaps 17. A mass 23 is coupled to one or more flexural members 21, is separated from the substrate 11 and comprises a grid 24. The grid 24 may be formed as a plurality of holes 25 or openings 25 formed through the mass 23. Widths of lines 27 comprising the grid 24 are approximately ⅓ the width of the one or more flexural members 21.

Figure 2:
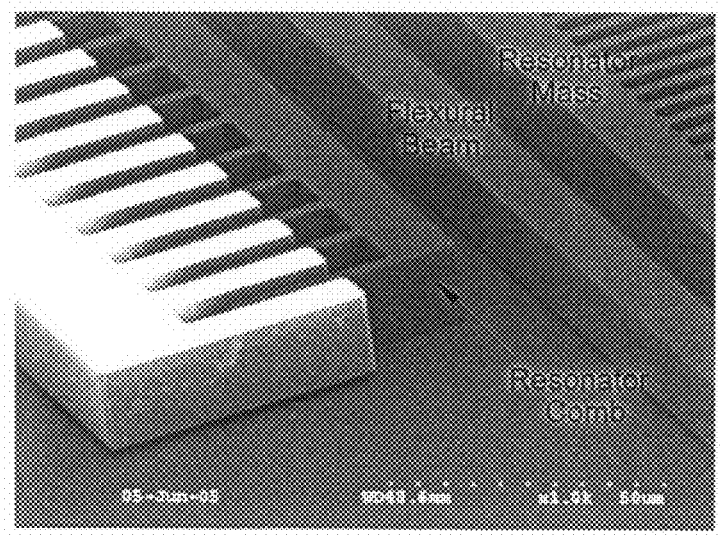
FIG. 2 illustrates an enlarged SEM view of the resonator shown in FIG. 1.
Figure 1A:
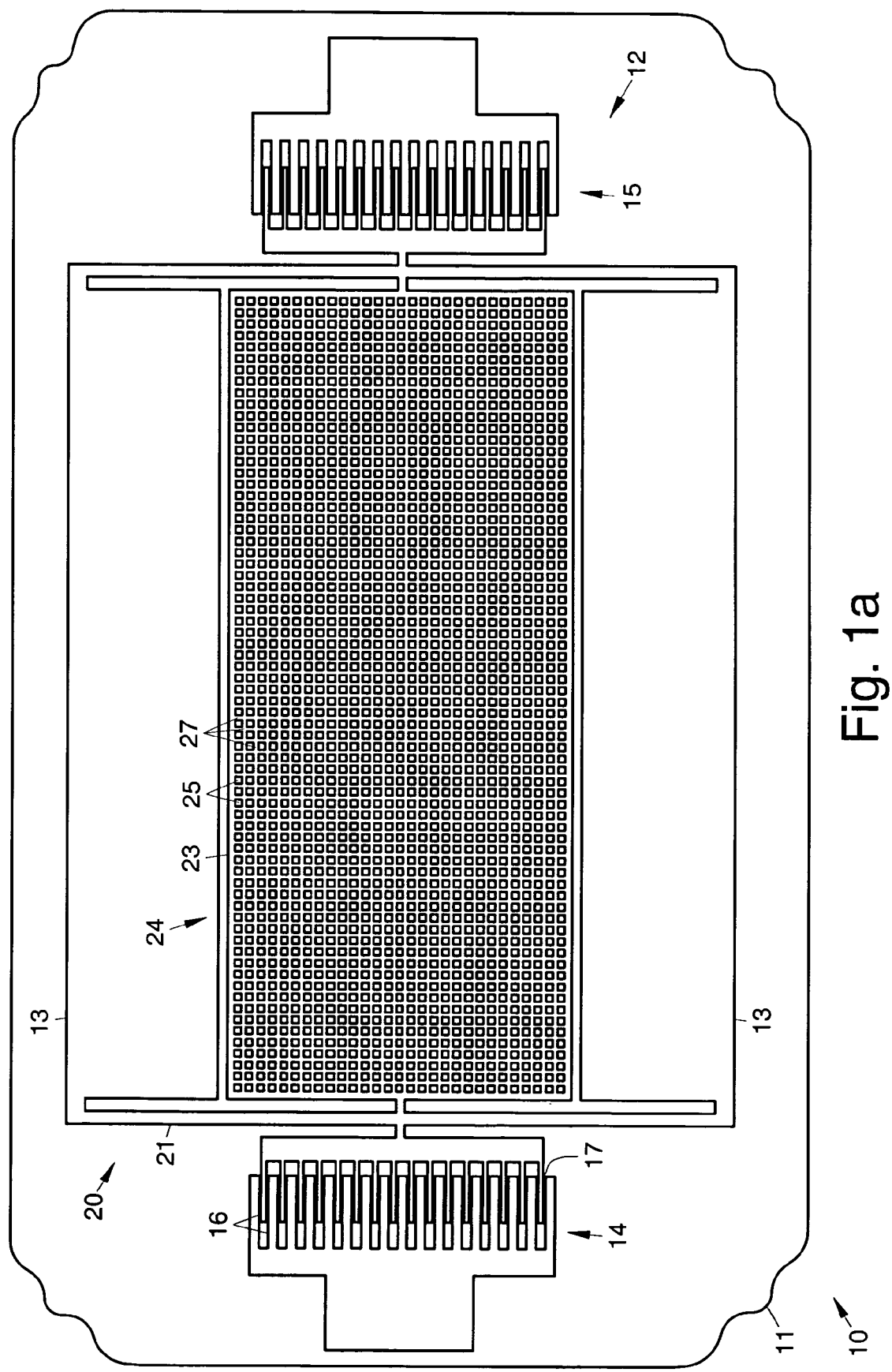
FIG. 1a is a top view of the exemplary comb drive resonator shown in FIG. 1.

The at least one input/output port 14, 15, or excitation/sense port 14, 15 may comprise a comb drive input port 14 or excitation port 14 such as is shown at the left side of FIG. 1 and a corresponding comb drive output port 15 or sense port 15 such as is shown at the right side of FIG. 1. The comb drive input/output port 14, 15, or excitation/sense port 14, 15 comprises a plurality of interdigitated fingers 16 separated by gaps 17. FIG. 2 shows an enlarged SEM view of the resonator 10 shown in FIG. 1 illustrating the exemplary comb drive input or excitation port 14.

Figure 3:
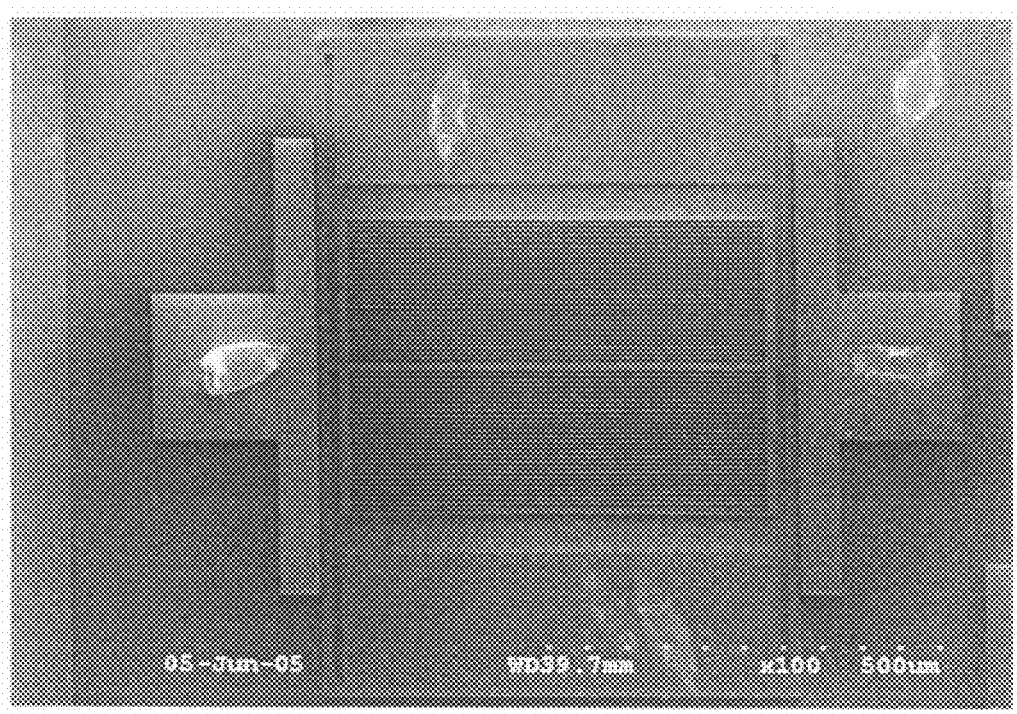
FIG. 3 is a SEM view of an exemplary parallel-plate drive resonator.
Figure 4:
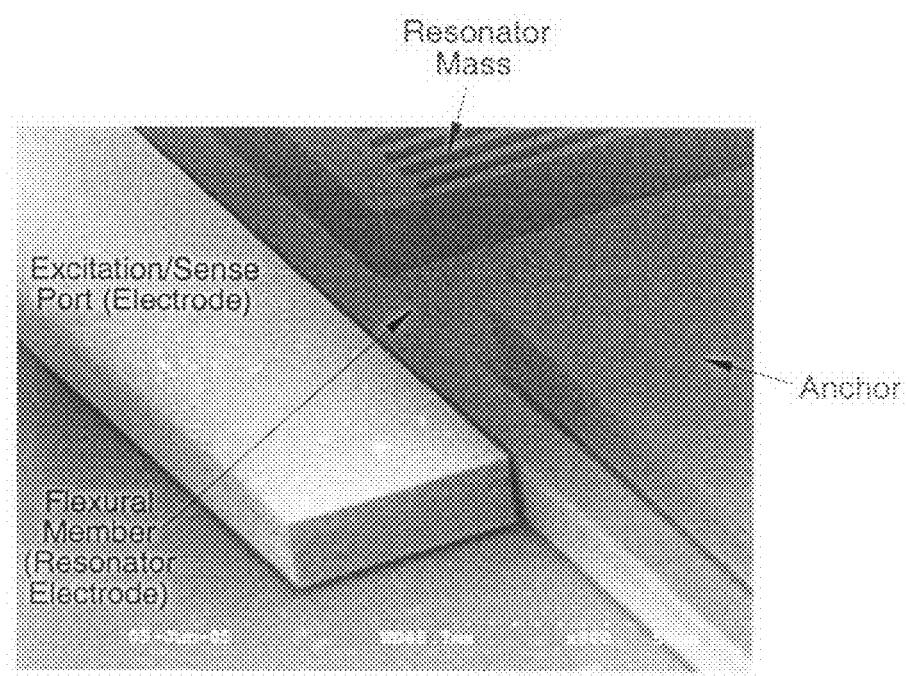
FIG. 4 illustrates another enlarged SEM view of the resonator shown in FIG. 3.
Figure 3A:
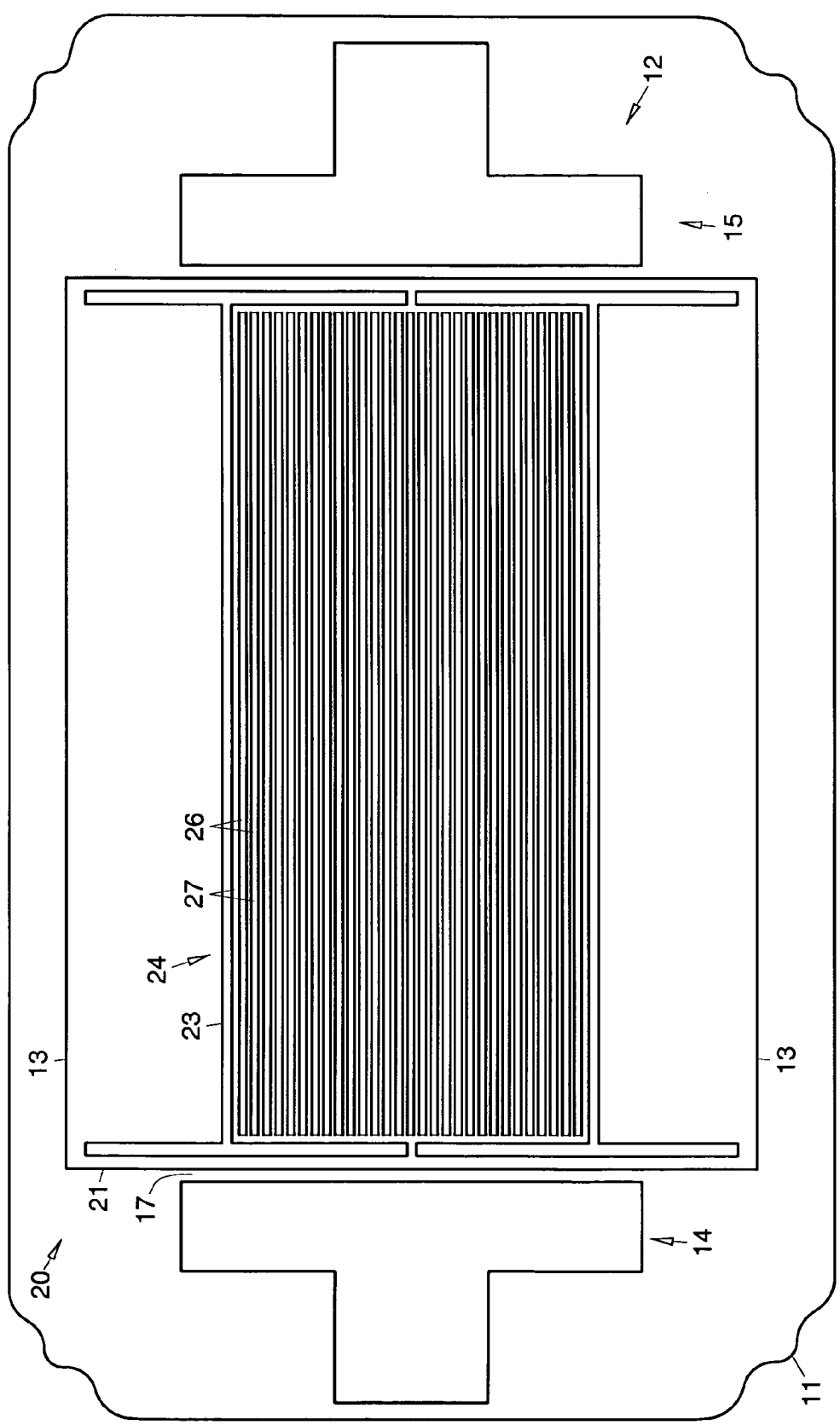
FIG. 3a is a top view of the exemplary parallel-plate drive resonator shown in FIG. 3.

Alternatively, and as is shown in FIG. 3, the resonator 10 may comprise a parallel plate resonator 10. FIG. 3 is a SEM view of an exemplary parallel-plate drive resonator 10. FIG. 3a is a top view of the exemplary parallel-plate drive resonator 10 shown in FIG. 3. The exemplary parallel plate resonator 10 comprises at least one input/output port 14, 15, or excitation/sense port 14, 15, which in this embodiment, comprises a parallel plate drive input/output port 14, 15 or excitation/sense port 14, 15. In the parallel plate resonator 10, the grid 24 is defined by a plurality of transverse lines 27 that form a plurality of lateral slots 26. It is to be understood, however, that the parallel-plate drive resonator 10 may also be configured to have its mass 23 configured as a grid 24 comprising a plurality of holes 25 or openings 25, and that the comb drive resonator 10 may have a mass 23 configured as a plurality of lateral slots 26. FIG. 4 shows another enlarged SEM view of the resonator 10 shown in FIG. 3.

Process Compensation

In low frequency ($\leq$ 1 MHz) applications, either a comb-drive resonator 10 or a parallel plate beam resonator 10 may be used, both of which use flexural beam-like structures (flexural members 21) to provide mechanical stiffness. The mechanical stiffness of a beam in flexure is dependant on the beam width, w, to the third power. Thus, the stiffness variation due to the width (defined as the critical dimension) variation is:

$$\Delta k = k' - k \propto (w + \Delta w)^3 - \omega^3 \propto (w^3 + 3w^2\Delta\omega + 3\omega\Delta\omega^2 + \Delta\omega^3) - \omega^3 \propto 3w^2\Delta\omega + 3\omega\Delta\omega^2 + \Delta\omega^3 \cdot \delta$$

Linearizing, $\Delta k \propto 3w^2\Delta\omega w$. In terms of percentage change, $$\frac{\Delta k}{k} \propto \frac{3w^2 \Delta w}{w^3} = 3\frac{\Delta w}{w}.$$

Therefore, the linear approximated stiffness variation is three times the critical dimension variation.

For the natural frequency, $\omega = (k/m)^{0.5}$, to have reduced sensitivity to the critical dimension variation, the fractional mass variation must be similar to the fractional stiffness variation. From the above equation, the fractional mass variation is approximately three times the fractional critical dimension variation.

This feature is straightforward to implement in low frequency (less than 1 MHz) flexural resonators 10. These resonators 10 are typically mass-loaded, in that there exists a large mass 23 that can be effectively modeled as a point mass. As was described above, this large mass 23 may be formed as a grid 24 of lines 27, each of which are approximately ⅓ the width of the stiffness-defining flexural beam 21. For example, if the flexural beam width is about 12 μm, the grid line width is made at ~4 μm. Thus, any critical dimension variation will satisfy the stiffness and mass variation equations above.

Figure 5:
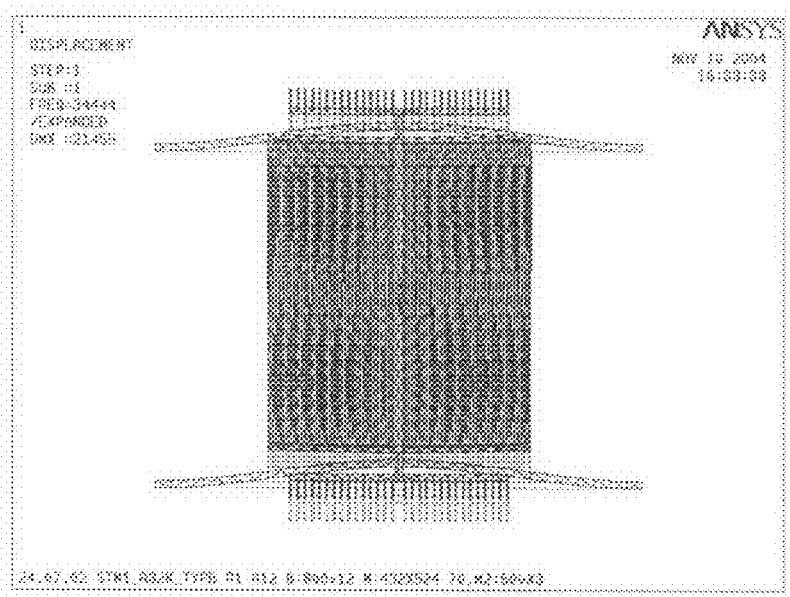
FIG. 5 illustrates an ANSYS simulation of an exemplary comb drive resonator.
Figure 6:
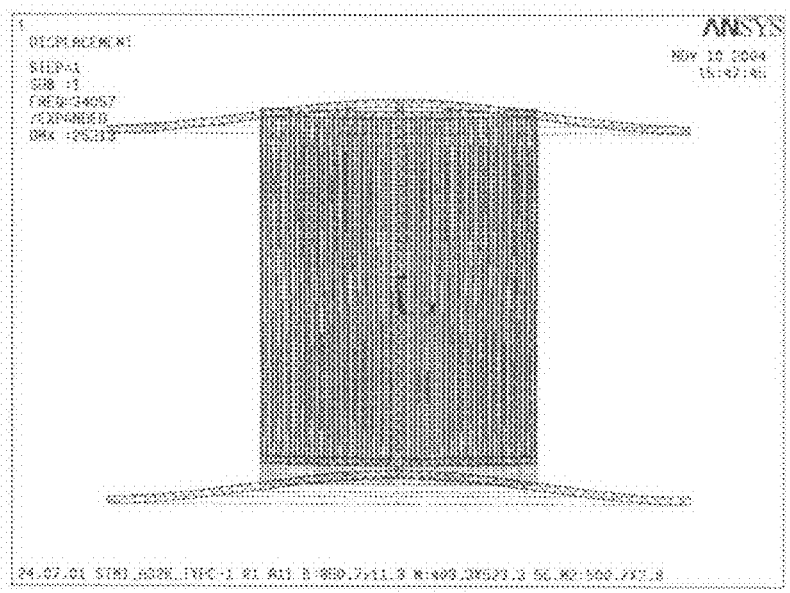
FIG. 6 illustrates an ANSYS simulation of an exemplary parallel plate resonator.

FIG. 5 illustrates an ANSYS simulation of an exemplary reduced-to-practice comb drive resonator 10. FIG. 6 illustrates an ANSYS simulation of an exemplary reduced-to-practice parallel plate resonator 10.

Temperature Stability Via Oxide Deposition

Since silicon dioxide (oxide) has a positive $\gamma_{v\alpha}$, a composite structure with a controlled ratio between oxide and semiconductor material provides a zero gradient of frequency to temperature, thus providing temperature stability.

Figure 7:
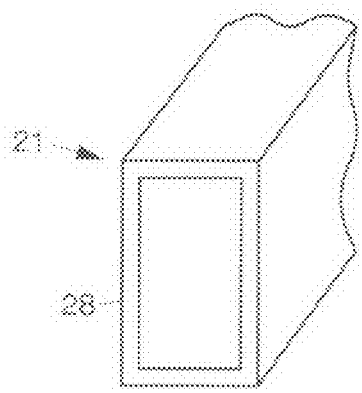
FIG. 7 illustrates an exemplary cross section of a flexural member of a resonator that has reduced temperature dependence.

In the flexural members 21, its stiffness is a function of the stiffness (Young's) modulus E, moment of inertia I, and the length L.

$$k = \frac{1}{\beta_j} \frac{EI}{L^3}$$

where β is a dimensionless parameter based on the boundary conditions and loading. From the parallel axis theorem, areas far from the neutral axis of a flexural member 21 (i.e., on the outer surface) have greater contribution to the moment of inertia I. Thus, oxide disposition (via growth or deposition) on the surface of a silicon comb drive or parallel plate resonator 10 is very effective. Since oxide growth and chemical vapor deposition (CVD) processes can be tightly-controlled, an accurate amount of oxide can be attained on the structure. With reference to FIG. 7, one or more outer surface of the structural-stiffness-defining flexural beam 21 is covered with a silicon dioxide film 28. This form of temperature stability improvement is particularly useful for comb drive resonators 10 in FIG. 1, although it can also be applied to parallel plate resonators 10 in FIG. 3.

Temperature Stability Via $V_p$ Tuning

Figure 8:
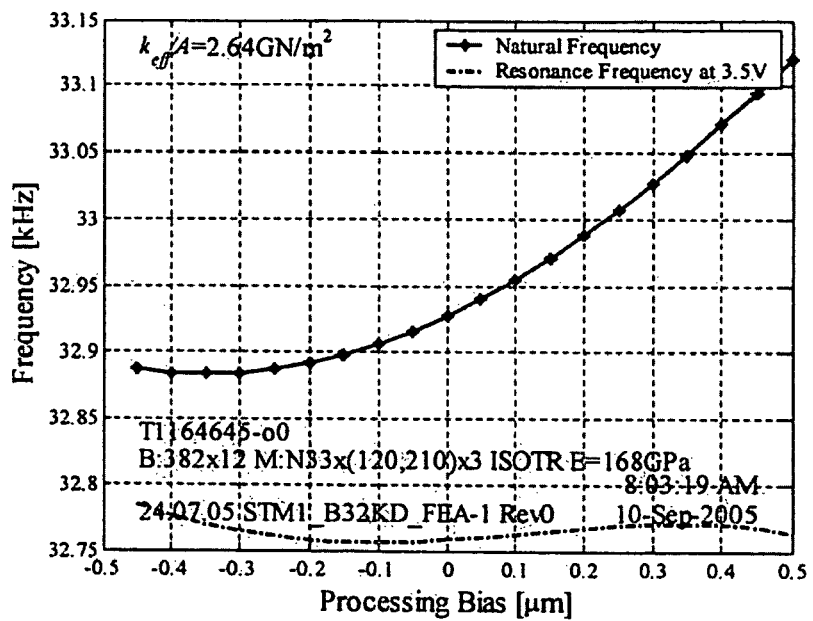
FIG. 8 is a graph showing natural frequency and tuned resonance frequency versus processing bias for the exemplary parallel plate drive resonator shown in FIG. 3.

In capacitive parallel plate resonators 10, a polarization voltage $V_p$ applied across the transduction gap 17 also tunes the frequency of the resonator 10. The amount of frequency tuning is a strong function of the gap size. Using the fabrication processes described in U.S. Pat. No. 7,176,770, issued Feb. 13, 2007, and U.S. application Ser. No. 11/251,197, filed Oct. 15, 2005, the gap dimension is controlled well. When the transduction gap 17 is also defined lithographically and with subsequent micromachining, the gap size will vary. Positive bias on the width a flexural beam 21 or line feature of mass 23 will result in negative bias on the gap size and vice-versa. This characteristic is used to complement the mechanical compensation and further improve the robustness of the resonator 10. FIG. 8 is a graph showing frequency versus processing bias for the exemplary parallel plate resonator 10 shown in FIG. 3. In FIG. 8, the process variation of such gap size is further utilized for reducing the process sensitivity, from the untuned mechanical natural frequency to the tuned resonance frequency.

Figure 9:
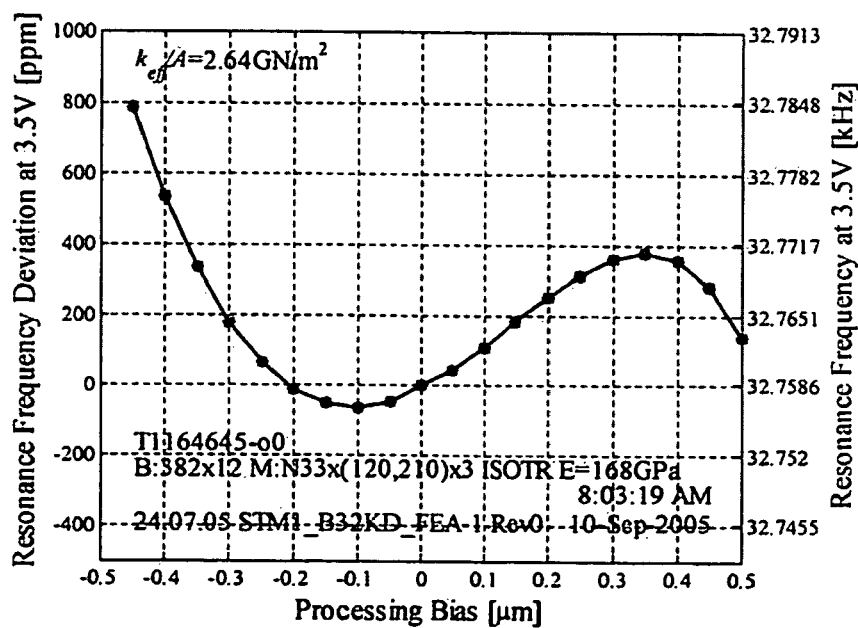
FIG. 9 is a graph showing tuned resonance frequency deviation and resonance frequency versus processing bias for the exemplary parallel plate drive resonator shown in FIG. 3.

The frequency variation of the compensated resonators 10 are dependant on the size/tolerance of the critical dimension variations. For a ±0.2 μm critical dimension variation window, as little as ±20 ppm frequency variation is possible. For a ±0.4 μm critical dimension variation window, Δf is about 400 ppm. FIG. 9 is a graph showing resonant frequency deviation and resonance frequency versus processing bias for the exemplary parallel plate resonator 10 shown in FIG. 3.

For low-power oscillator implementations, resonator motional impedance must be sufficiently low to start-up and sustain oscillations. Motional impedance can typically be reduced by reducing gap size and large polarization voltages. However, these two solutions are not attractive for manufacturability (i.e., yield) and low-power implementation. Hence, the design must enable low motional impedance with alternative solutions.

If electrical temperature compensation is required, a preferred implementation involves the use of polarization-voltage correction. For example, the typical temperature dependence of a silicon resonator is about −25 ppm/° C. Over a 160° C. range, 4000 ppm of tuning is required. The tuning effectiveness of $V_p$ is dependant on the electrostatic tuning coefficient (ETC) of the resonator 10. The fractional frequency tuning is given by $$\frac{\Delta f}{f} = ETC \cdot (V_{P2}^2 - V_{P1}^2).$$

Figure 10:
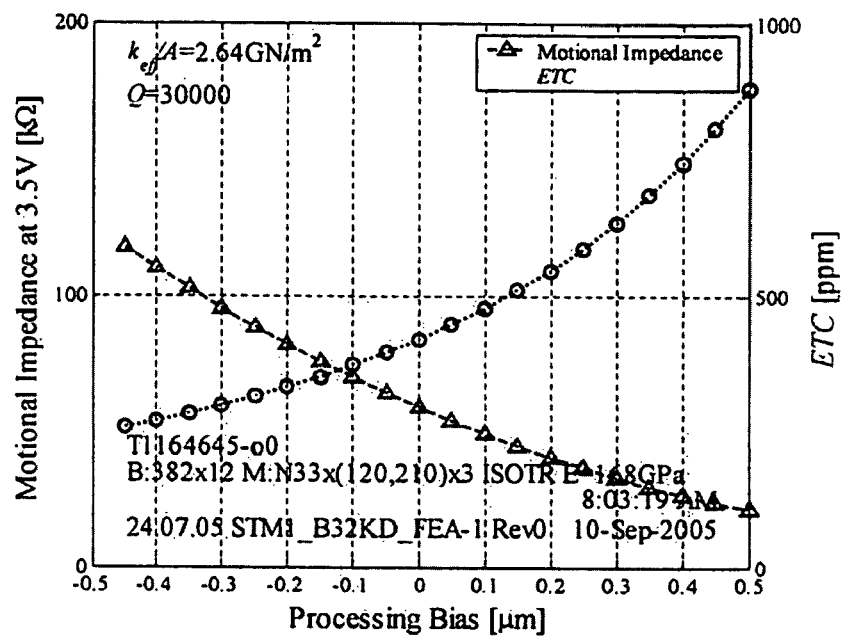
FIG. 10 is a graph showing motional impedance and electrostatic tuning coefficient versus processing bias for the exemplary parallel plate drive resonator shown in FIG. 3.

Although greater tunability is possible with large $V_p$, generating large voltages will be at the cost of power consumption. Therefore, the design must provide a sufficiently large electrostatic tuning coefficient (ETC) to allow for temperature compensation with low voltages. FIG. 10 is a graph showing motional impedance and ETC versus processing bias for the exemplary parallel plate resonator 10 shown in FIG. 3.

Figure 11:
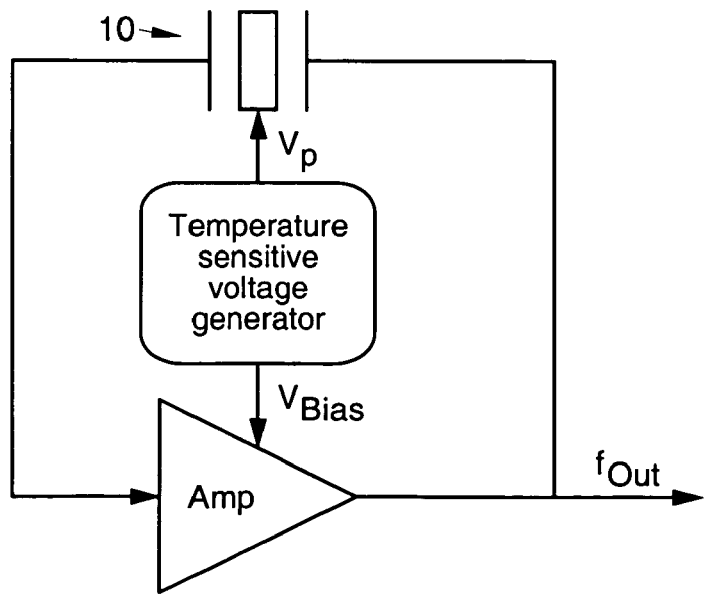
FIG. 11 illustrates an exemplary oscillator in which a temperature-controlled bias generator supplies the polarization voltage for a resonator

It is desirable that interface electronics be simple and consume minimal power. To satisfy these requirements, an IC shares a temperature sensitive bias control between the resonator 10 and an amplifier. The amplifier is biased in the sub-threshold region to further minimize power consumption. FIG. 11 illustrates an exemplary oscillator in which a temperature-controlled bias generator (Temperature sensitive generator) supplies the polarization voltage to a resonator 10.

An exemplary bias control block comprises a temperature sensor and a square-root generator to account for the parabolic tuning characteristic of the resonator 10. A temperature sensor based on a curvature compensated PTAT current generator may be used as an input to square-root generator that generates the appropriate bias voltage.

32 kHz Resonator

There are several requirements and constraints relating to the design of a 32 kHz resonator 10, for example. These are that it be robust to process variations, have low $V_p$ sensitivity, and low $V_p$ operation for low power-consumption oscillators. It is to be understood that the described techniques may be extended to resonators 10 that operate at other frequencies.

Thus, temperature compensated micromechanical resonators have been disclosed. It is to be understood that the above-described embodiments are merely illustrative of some of the many specific embodiments that represent applications of the principles discussed above. Clearly, numerous and other arrangements can be readily devised by those skilled in the art without departing from the scope of the invention.

What is claimed is:

1. A micromechanical resonator apparatus, comprising:
    a substrate; and
    a resonator apparatus comprising:
        first and second anchors connected to the substrate;
        at least one excitation/sense port that is electrically insulated from the substrate, the at least one excitation/sense port comprising a parallel plate capacitive transducer; and
        a resonator comprising:
            at least one flexural beam member connected to the first and second anchors, the at least one flexural beam member separated from the substrate and separated from the at least one excitation/sense port by one or more gaps, where the at least one flexural beam member is a moveable electrode for the parallel plate capacitive transducer; and
            a mass disposed between the first and second anchors, the mass coupled to the at least one flexural beam member between the first and second anchors and separated from the substrate, the mass comprising a grid.

2. The apparatus recited in claim 1 wherein the at least one flexural beam member has a beam width and widths of lines comprising the grid are approximately ⅓ the beam width.

3. The apparatus recited in claim 1 wherein the substrate comprises a semiconductor-on-insulator substrate.

4. The apparatus recited in claim 1 wherein a temperature-compensating material is disposed on at least one of the surfaces of the at least one flexural beam member to alter the temperature coefficient or frequency of the micromechanical resonator.

5. The apparatus recited in claim 1 wherein a tuning voltage applied to the resonator is generated by a bias generator.

6. The apparatus recited in claim 1 wherein the resonator further comprises a second flexural beam member connected to the first and second anchors, the second flexural beam member separated from the substrate, the mass coupled to the at least one flexural beam member at a first end and coupled to the second flexural beam member between the first and second anchors at a second end opposite the first end.

7. A micromechanical resonator apparatus, comprising:
    a semiconductor-on-insulator substrate; and
    a resonator apparatus comprising:
        first and second anchors connected to the semiconductor-on-insulator substrate;
        at least one excitation/sense port that is electrically insulated from the semiconductor-on-insulator substrate;
        a resonator comprising at least one flexural beam member connected to the first and second anchors, the at least one flexural beam member having a beam width, the at least one flexural beam member separated from the semiconductor-on-insulator substrate and separated from the at least one excitation/sense port by one or more gaps; and
        a mass disposed between the first and second anchors, the mass coupled to the at least one flexural beam member and separated from the semiconductor-on-insulator substrate, the mass comprising a grid of lines, the lines approximately ⅓ the beam width.

8. The apparatus recited in claim 7 wherein the at least one excitation/sense port comprises a comb drive having a plurality of interdigitated fingers separated by gaps.

9. The apparatus recited in claim 7 wherein the at least one excitation/sense port comprises a parallel plate drive where the at least one flexural beam member is a moveable electrode for the parallel plate drive.

10. The apparatus recited in claim 7 wherein oxide is disposed on at least one of the surfaces of the at least one flexural beam member.

11. The apparatus recited in claim 7 wherein a tuning voltage applied to the resonator is generated by a bias generator.

12. The apparatus recited in claim 7 wherein the resonator further comprises a second flexural beam member connected to the first and second anchors, the second flexural beam member separated from the semiconductor-on-insulator substrate, the mass coupled to the at least one flexural beam member at a first end and coupled to the second flexural beam member at a second end opposite the first end.

13. A micromechanical resonator apparatus, comprising:
a substrate; and
a resonator apparatus comprising:
one or more anchors connected to the substrate;
at least one excitation/sense port that is electrically insulated from the substrate;
at least one tuning port that is electrically insulated from the substrate; and
a resonator comprising:
at least one flexural beam member connected to the one or more anchors, the at least one flexural beam member having a beam width, the at least one flexural beam member separated from the substrate and separated from the at least one excitation/sense port by one or more gaps and separated from the at least one tuning port by one or more gaps; and
a mass coupled to the at least one flexural beam member and separated from the substrate, the mass comprising a grid;
wherein the at least one excitation/sense port comprises a parallel plate drive where the at least one flexural beam member is a moveable electrode for the parallel plate drive.

14. The apparatus recited in claim 13 wherein the substrate comprises a semiconductor-on-insulator substrate.

15. The apparatus recited in claim 13 wherein oxide is disposed on at least one of the surfaces of the at least one flexural beam member.

16. The apparatus recited in claim 13 wherein a tuning voltage is generated by a bias generator.

17. The apparatus recited in claim 13 wherein widths of lines comprising the grid of the mass are approximately $\frac{1}{3}$ the beam width.

* * * * *